（12）United States Patent
Sekowski et al.

(10) Patent No.: US 8,184,440 B2
(45) Date of Patent: May 22, 2012

(54) ELECTRONIC APPARATUS HAVING AN ENCAPSULATING LAYER WITHIN AND OUTSIDE OF A MOLDED FRAME OVERLYING A CONNECTION ARRANGEMENT ON A CIRCUIT BOARD

(75) Inventors: Daniel Sekowski, Lafayette, IN (US); Frederick Lloyd Carpenter, Conyers, GA (US); Mark Anthony Hand, Convington, GA (US); Bernhard Bachl, Regensburg (DE); Bernd Bienek, Oberhausen (DE); Olaf Cladders, Kamp-Lintfort (DE); Henning Dieker, Meerbusch (DE); Christian Miesner, Toenisvorst (DE); Lothar Schopmann, Kamp-Lintfort (DE); Herfried Zimmer, Oberhausen (DE)

(73) Assignee: ABL IP Holding LLC, Conyers, GA (US)

( * ) Notice: Subject to any disclaimer, the term of this patent is extended or adjusted under 35 U.S.C. 154(b) by 426 days.

(21) Appl. No.: 12/434,313

(22) Filed: May 1, 2009

(65) Prior Publication Data

US 2010/0277921 A1  Nov. 4, 2010

(51) Int. Cl.
*H05K 7/20* (2006.01)
(52) U.S. Cl. ........................................................ 361/723
(58) Field of Classification Search .................. 174/260; 361/260, 704, 707, 715–723; 362/277, 373
See application file for complete search history.

(56) References Cited

U.S. PATENT DOCUMENTS

| | | | | |
|---|---|---|---|---|
| 5,402,088 A | * | 3/1995 | Pierro et al. | 333/33 |
| 5,708,567 A | * | 1/1998 | Shim et al. | 361/723 |
| 6,265,767 B1 | * | 7/2001 | Gaku et al. | 257/678 |
| 6,300,673 B1 | * | 10/2001 | Hoffman et al. | 257/666 |
| 6,605,867 B2 | * | 8/2003 | Yamada | 257/698 |
| 6,860,621 B2 | * | 3/2005 | Bachl et al. | 362/373 |
| 7,058,250 B2 | * | 6/2006 | Bachl et al. | 385/15 |
| 2011/0114840 A1 | * | 5/2011 | Yamazaki et al. | 250/338.1 |

* cited by examiner

*Primary Examiner* — Chandrika Prasad
(74) *Attorney, Agent, or Firm* — Kilpatrick Townsend & Stockton LLP

(57) ABSTRACT

In an electronic apparatus comprising a circuit board supporting semiconductor components and traces or conductors for supplying electrical energy to the semiconductor components, and a connection arrangement by which the conductors are connected to a power supply cable, the circuit board being covered by an electrically insulating encapsulating layer, a molded frame part is mounted on the circuit board so as to cover the connection arrangement, the molded frame part having a circumferential edge structure which extends on one end into the encapsulating layer and at the other end projects above the encapsulating layer so as to create an interior space which, when the encapsulating layer is at least partially cured, is filled with additional encapsulating compound to form, after curing, a relatively thick protective layer over the wire or cable and conductor connecting area.

9 Claims, 3 Drawing Sheets

US 8,184,440 B2

ELECTRONIC APPARATUS HAVING AN ENCAPSULATING LAYER WITHIN AND OUTSIDE OF A MOLDED FRAME OVERLYING A CONNECTION ARRANGEMENT ON A CIRCUIT BOARD

BACKGROUND OF THE INVENTION

The invention resides in an electronic apparatus, particularly for lighting purposes and in a method for the manufacture of such an apparatus.

Electronic apparatus such as light emitting diode units or other units used for lighting purposes often need to be encapsulated in a sealing compound because its components need to be protected from moisture.

In an apparatus in which a plurality of light emitting diodes are combined into a light emitting diode module, the light emitting diodes are preferably connected in an electrical series circuit arrangement in order to reduce electrical power losses. In such a series circuit arrangement, substantial voltages of up to several 100 volts may be applied. It is therefore necessary to ensure individual's safety and provide protection to prevent contact with parts energized with such high voltages. This requires relatively thick encapsulating material layers.

For supplying electrical power to such components electrical conductors or traces extend, and are connected, to the light emitting diode module. In the areas where the conductors are connected to the modules, metallic terminals may project from the light emitting diode module relatively far and at a level above the surface of the flat circuit board on which the light emitting diode module is mounted. It must be ensured that these projecting parts cannot be touched by a person handling the apparatus. The terminals are therefore generally covered by an insulating material. Absolute protection from contact with these connecting areas however cannot be ensured by an increased thickness of a encapsulating compound layer deposited on the circuit board since there are limits for the thickness of such an insulating layer. The electronic light sources such as light emitting diodes are relatively flat. If they are covered by the encapsulating compound, their light emitting efficiency is at the least reduced.

It is therefore the object of the present invention to provide an apparatus and a method of manufacturing such an apparatus which provides for a high degree of safety while also providing a relatively low construction height of the electronic component supported on a circuit board of the apparatus.

SUMMARY OF THE INVENTION

In an electronic apparatus comprising a circuit board supporting semiconductor components and conductors or traces for supplying electrical energy to the semiconductor components, and a connection arrangement by which the conductors are connected to a power supply cable, the circuit board being covered by an electrically insulating encapsulating layer, a molded frame part is mounted on the circuit board so as to cover the connection arrangement, the molded frame part having a circumferential edge structure which extends on one side into the encapsulating layer and on the opposite side projects above the encapsulating layer so as to create an interior pocket which, when the encapsulating layer is at least partially cured, is filled with additional encapsulating compound to form, once fully curing, a relatively thick protective layer over the cable and conductor connection area.

The encapsulated electrical apparatus according to the invention may be for example a light emitting diode lighting apparatus or another electronic device. It comprises a circuit board for example in the form of a flat plate. This flat plate may furthermore be a printed circuit board such as a plastic plate with conductors disposed on the top side thereof. The circuit board may also be in the form of a flat metal plate or sheet metal or similar structure which is provided with an insulating layer on one side on which the conductors or traces are disposed. For example, the circuit board may be an aluminum sheet or an aluminum plate provided with an aluminum oxide layer on one side on which the conductors are arranged.

The conductors or traces are power supply lines and/or control lines of at least one but preferably several semiconductor components. In a preferred embodiment at least some of the semiconductor components are light generators. The semiconductor components may be arranged on the circuit board in the form of naked chips or as encapsulated components.

At least one of the conductors or traces placed on the circuit board extends to a connection area where it is connected to an electric power supply line. The connection area is on what is referred to as the top side of the circuit board. In the apparatus according to the invention, the top surface of the circuit board is constructed with a molded electrically insulating layer which forms on the circuit board a solid and essentially uniform cover, which insulates the conductors. The thickness of the layer is preferably selected so that at least the light emitting area or, respectively, light exit window of a light emitting electronic semiconductor component remains uncovered and unobstructed.

At the connecting area, a molded frame part is mounted which, in a top view, has a preferably rectangular or if appropriate hexagonal or round circumferential edge structure. The edge structure projects above the encapsulating layer and surrounds an interior space which extends higher than the encapsulating layer and which is also filled with encapsulating compound. The encapsulating compound in the interior space may be the same encapsulating compound or a encapsulating compound different from that of the first encapsulating compound layer.

By attaching the molded frame part at the connection area, it becomes possible, in a simple manner, to substantially increase the thickness of the encapsulating layer in the connection area over the surrounding area. In this way, high voltage power carrying parts are safely covered so that there is no danger of contact with a connection carrying for example 400 Volts.

The circumferential edge area of the molded frame part is preferably a continuous wall so that the molded frame part can be filled with encapsulating compound which is then contained therein.

Furthermore, the edge area extends preferably over its whole circumference into the encapsulating layer. In this way, the interior of the frame can be filled with additional encapsulating compound since the encapsulating compound already present seals the molded frame part at the lower end and prevents the fresh, still liquid, encapsulating compound from leaking out.

As shown, the molded frame part includes at least two openings, that is, a first side opening which is mounted in the encapsulating layer and via which during formation of the encapsulating compound layer encapsulating compound can flow into the lower part of the interior space of the molded frame part and an upper opening for filling the interior of the molded frame part upon curing or at least partial curing of the earlier applied encapsulating compound layer.

In a preferred embodiment, the molded frame part has four legs between which channels are formed for permitting encapsulating compound to flow into the interior of the molded frame part. Again, the molded frame part is open at it's top. It is constructed preferably of an electrically insulating material such as a plastic or a ceramic material.

The encapsulating layer and the molded frame part may be covered by a correspondingly formed metal plate. The metal plate may be provided with a recess accommodating the molded frame part, so that the metal plate can be placed in contact with the encapsulating layer and the molded frame part practically over the whole surface thereof. The metal plate results in increased safety particularly with regard to protection from flames. The metal plate is preferably bonded to the encapsulating layer over the whole surface thereof.

Additional features and advantageous embodiments of the invention will become apparent from the following description of important aspects of the invention on the basis of the accompanying drawings.

DETAILED DESCRIPTION OF PARTICULAR EMBODIMENTS

Figure 1:
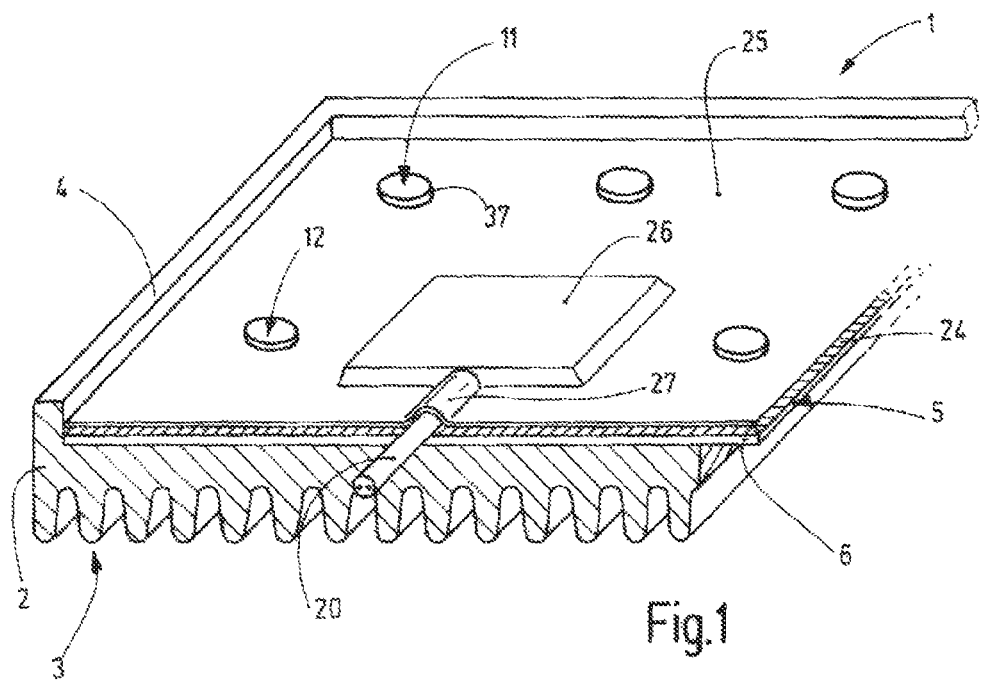
FIG. 1 shows schematically in a perspective view a section of an electronic apparatus according to the invention.

FIG. 1 shows a section of an apparatus 1 suitable for example as a room luminaire. The electronic apparatus 1 includes a housing 2 shown here as a heatsink with cooling ribs 3. The housing 2 includes—as represented in FIG. 1—an upper front surface, a preferably planar thermal contact surface which is surrounded by a rib or wall 4. The space surrounded by the rib or wall 4 accommodates a light emitting diode module 5.

Figure 2:
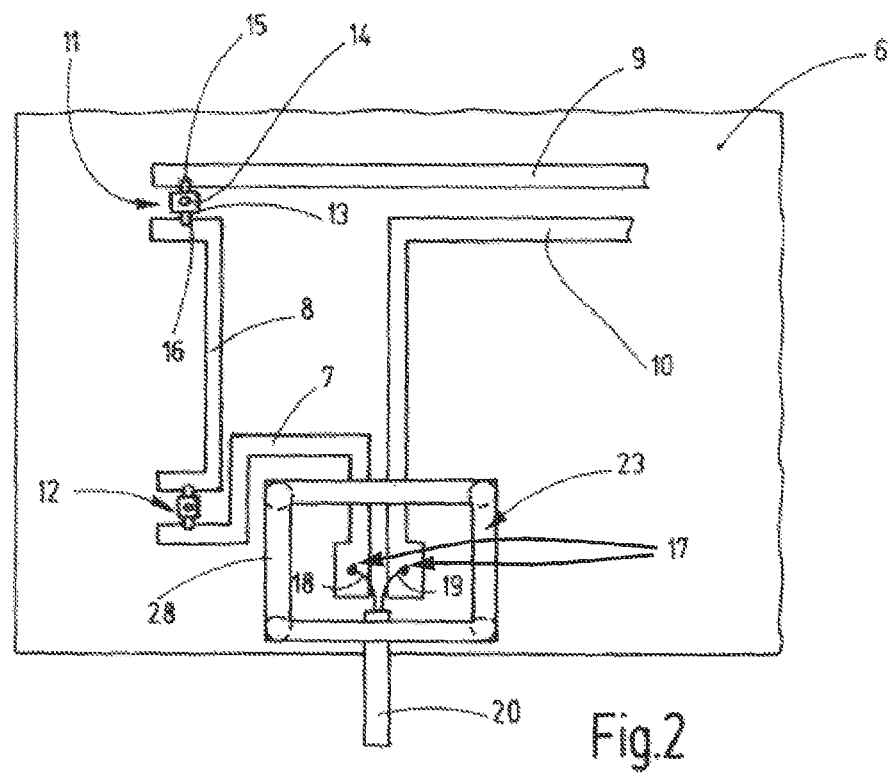
FIG. 2 shows schematically the apparatus of FIG. 1 in a sectional top view without encapsulating layer.

The light emitting diode module 5 comprises a preferably planar plate-like circuit board 6 which is in a preferred embodiment a thermally conductive printed circuit board. The printed circuit board may consist of plastic material or possibly of a metal such as aluminum. The circuit board 6 has at least one electrically insulating layer and, if it consists for example of aluminum, it may be constructed with an aluminum oxide layer or another dielectric layer. On the insulating layer conductors or traces 7, 8, 9, 10 may be arranged as shown in FIG. 2, via which semiconductor components 11, 12 are supplied with electric current. Such a semiconductor component 11 may be for example an individual light emitting diode in a miniature housing 13 with a light emission window 14 or lens 37.

Figure 4:
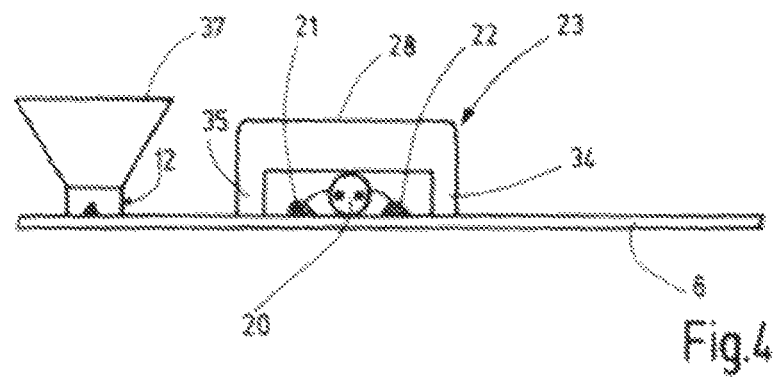
FIGS. 4 to 7 show the electronic apparatus schematically in cross-sections during different manufacturing stages.

The semiconductor component 11 may include terminals 15, 16 which are connected to traces or conductors 8, 9 for example by solder joints. By an expedient circuit arrangement of the conductors 7, 8, 9, 10 and corresponding semiconductor components 11, 12 (and additional elements) a series circuit can be established including a large number of semiconductor components 11, 12. The power supply for these and additional semiconductor components 11, 12 may be provided at a relatively high voltage of about 400 V but a relatively small current. In the embodiment according to FIG. 2, the conductors 7, 10 are the power supply conductors or traces. In accordance therewith, they end at a connection arrangement 17 where the wires 18, 19 are connected to the conductors 7, 10. The wires 18, 19 may be connected to the conductors 7, 10 by corresponding solder connections 21, 22 as indicated in FIG. 4. The wires 18, 19 may be part of a power supplying stranded cable 20 or at least one separately insulated wire.

Figure 3:
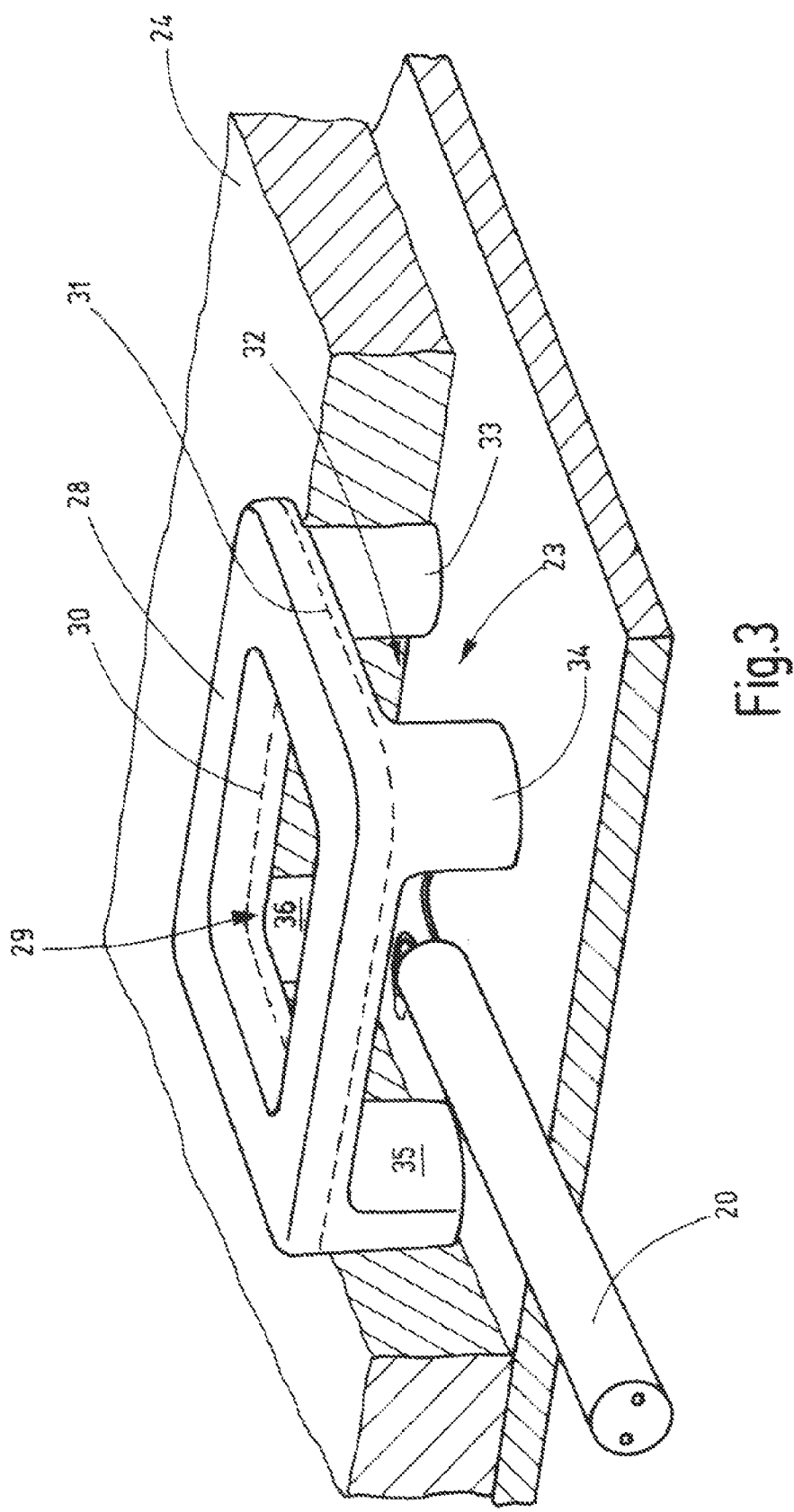
FIG. 3 is a perspective view of parts of the electronic apparatus.

The connection arrangement 17 further includes a molded frame part 23, which is disposed on a encapsulating layer 24 applied to the circuit board 6 and which projects therefrom upwardly. This is shown in FIG. 3 which shows the encapsulating layer 24 in a substantially enlarged format with a part of the encapsulating layer 24 being removed around the connection arrangement 17.

As shown in FIG. 1, the encapsulating layer 24 covers preferably the whole circuit board 6 with the exception of the semiconductor components 11, 12 or, respectively, the light emission windows thereof. The encapsulating layer 24 itself is covered by a cover sheet 25 which has a circumferential edge abutting the outer rib or wall 4 of the housing 2. The cover sheet 25 may be a metal sheet which may be bonded onto the encapsulating layer 24 over the whole area thereof for example by a bonding compound filling any gap between the abutting encapsulating layer and the cover sheet surfaces. Alternatively, the cover sheet 25 may be pressed onto the encapsulating layer for attachment thereto before the encapsulating layer is fully cured.

The cover sheet 25 is provided with cut-outs via which the light generated by the semiconductors can be emitted. Otherwise, the cover sheet 25 covers the whole encapsulating layer 24. It covers in particular the connection arrangement 17.

For accommodating the molded frame part 23 which projects from the encapsulating layer 24, the cover sheet 25 may be constructed with a correspondingly formed recess 26. It also may include a groove 27 for receiving the stranded cable 20 or insulated wires. The molded frame part 23 increases the thickness of the encapsulating layer 24 at the connection arrangement 17. The molded frame part consists preferably of an electrically non-conductive and thermally resistant material for example a ceramic or suitable plastic material. The molded frame part 23 has an annular closed frame structure 28 which, in the shown embodiment is rectangular and has a central opening 29. The frame part 23 extends into the encapsulating layer 24. The height of the encapsulating layer 24 at the molded frame part 23 is marked in FIG. 3 by dashed lines 30 and 31. The molded frame part 23 includes at least one further opening 32 which, in the embodiment shown in FIG. 3, is represented by the gap between the two legs 33, 34. The molded frame part 23 includes preferably two additional legs 35, 36.

The legs 33 to 36 are positioned such that one is at each corner of the rectangular molded frame part 23 and support the molded frame part 23 on the circuit board 6. The opening 29 is preferably centered over the connection area of the wires 18, 19.

Figure 5:
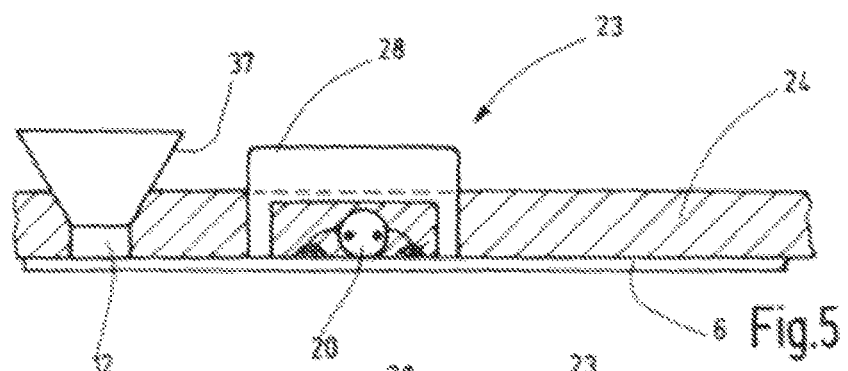
Figure 6:
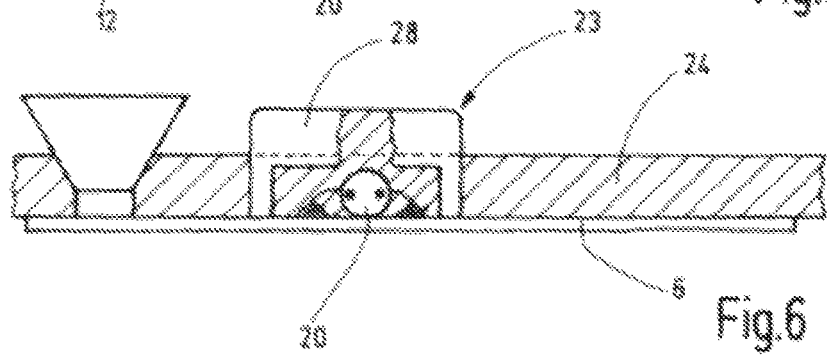

For the manufacture of the apparatus, preferably the following steps are followed:

First, the housing 2 is positioned, such that the ribs 3, which in the normal operational project upwardly, are facing downwards and at least one pre-assembled light emitting diode module 5 is placed into the cavity formed by the ribs or wall 4 of the housing 2. In this state, the at least one light emitting diode module 5 comprises the at least one circuit board 6 with the traces or conductors 7, 8, 9, 10, the semiconductor components 11, 12 (and more) mounted on the circuit board 6 and connected to the traces or conductors 7-10 and also the stranded or solid cable 20 connected to the traces or conductors 7 and/or 10. Also, optical elements such as lenses 37 may be attached to the semiconductor components 11, 12. Then the molded frame part 23 is placed onto the circuit board at the connection arrangement 17 as shown in FIG. 4. In the next step encapsulating compound is placed onto the circuit board 6 in order to form the encapsulating layer 24 as shown in FIG. 5. This layer completely covers the printed circuit board formed by the circuit board 6 and fixes the at least one light emitting diode module 5 on the housing 2. The encapsulating compound fills the interior space of the molded frame part 23 to a level as shown in FIG. 5 and in FIG. 3 by the dashed lines 30 and 31. The encapsulating compound encases everything thereby up to the ribs or wall 28 on all sides. Then the encapsulating compound is cured, at least partially until it is no longer flowing and has for example a jelly-like consistency. In this state, the partially finished apparatus 1 is transferred to the next manufacturing step of FIG. 6. In this step, additional encapsulating compound is filled into the molded frame part 23 via the central opening 29 so that the fill level within the molded frame part 23 is higher than the thickness of the encapsulating layer 24 outside the molded frame part 23. Preferably, the molded frame part is filled to the top with encapsulating compound. In FIG. 6, the edge structure 28 is shown broken away in an area facing the viewer in order to clearly show the filling level of the encapsulating compound 23 within the molded frame part 23.

Figure 7:
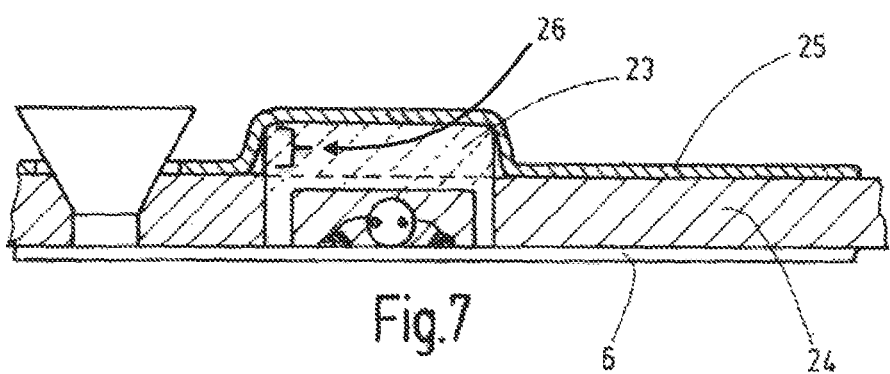

In the next and last step, the cover sheet 25 is applied, as shown in FIG. 7. The cover sheet 25 has a recess 26 which fits over the raised area formed by the molded frame part 23. If the encapsulating layer 24 is not yet cured but is still adhesive, the cover sheet 25 can be directly attached and fixed to the encapsulating layer 24. Alternatively, the cover sheet 25 is attached to the encapsulating compound layer 24 by means of an intermediate bonding layer.

It is also possible to apply the encapsulating layer 24 to the circuit board 6 before the molded frame part 23 is put in place. Then the molded frame part is placed in position while the encapsulating compound of the encapsulating layer 24 is still liquid so that it can still be properly positioned over the connection arrangement 17. Next the, at least partial, curing of the encapsulating layer is initiated.

The encapsulating layer 24 may be an encapsulating compound based on epoxy resin or it may comprise another plastic material which can be hardened by lattice-like polymerization and which then has duroplastic properties so that it does not easily melt in the case of extreme temperatures.

An apparatus 1 can be operated with a relatively high voltage power supply and can still have a relatively flat shape while complying with stringent safety requirements if on a corresponding circuit board 6, which supports the semiconductor components 11, 12, an encapsulating layer 24 is provided whose thickness is increased over the connection arrangement 17. To this end, a molded frame part 23 is placed over the connection arrangement 17. The molded frame part 28 has at least a top and a side opening with its sidewall structures immersed into the encapsulating layer 24. After at least partial curing of the encapsulating layer, the molded frame part is further filled via the top opening 29 as the encapsulating compound is now contained in the molded frame part 28. In this way, a suitable protective barrier can be created for example over a connection arrangement 17 by a sufficiently thick and reliable cover. If the molded frame part 23 consists of an electrically non-conductive material, it also safely prevents electrical contact of an optional cover plate 25 with any high voltage carrying components.

List of Reference Numerals

| | |
|---|---|
| 1 | Apparatus unit |
| 2 | Housing |
| 3 | Cooling ribs |
| 4 | Edge structure |
| 5 | Light emitting diode module |
| 6 | Circuit board |
| 7, 8, 9, 10 | Conductors |
| 11, 12 | Semiconductors |
| 13 | Miniature housing |
| 14 | Light emitting window |
| 15, 16 | Terminals |
| 17 | Connection arrangement |
| 18, 19 | Wires |
| 20 | Stranded cable |
| 21, 22 | Solder connections |
| 23 | Molded frame part |
| 24 | Encapsulating layer |
| 25 | Cover sheet |
| 26 | Recess |
| 27 | Grooves |
| 28 | Edge structure |
| 29 | Central opening |
| 30, 31 | Dashed lines indicating encapsulating compound surface level |
| 32 | Opening |
| 33-36 | Legs |
| 37 | Lens |

We claim:

1. An electronic apparatus comprising:
a circuit board;
at least one semiconductor component mounted on the circuit board;
at least one trace or conductor located on the circuit board and operably coupled to the at least one semiconductor component, the at least one conductor also being operably coupled to a connection arrangement mounted on the circuit board;
a molded frame part mounted on the circuit board and overlying the connection arrangement, wherein the molded frame part defines an interior cavity;
an electrically insulating encapsulating layer formed of an encapsulating compound positioned over at least part of the circuit board, wherein the encapsulating layer comprises a first portion located within the interior cavity of the molded frame part and a second portion located exterior the molded frame part, wherein the first portion is thicker than the second portion.

2. The electronic apparatus of claim 1, the molded frame part having an end which adjoins the circuit board, and at least one opening defined within the encapsulating layer at the end.

3. The electronic apparatus of claim 1, the molded frame part having a plurality of legs extending within the encapsulating layer.

4. The electronic apparatus of claim 1, the molded frame part having a top opening.

5. The electronic apparatus of claim 1, the molded frame part comprising an electrically insulating material.

6. The electronic apparatus of claim 1, further comprising a cover plate sized and shaped to cover the encapsulating layer and the molded frame part, the cover plate having a recess defined therein for receiving at least a portion of the molded frame part therein.

7. The electronic apparatus of claim 1, wherein the semiconductor component comprises a light emitting component.

8. The electronic apparatus of claim 7, the semiconductor component having a lens.

9. The electronic apparatus of claim 1, the connection arrangement including at least one connecting structure and a power supply cable or wire which is operably coupled to a trace or conductor operably coupled to the at least one semiconductor component.

* * * * *